(12) United States Patent
Nordal et al.

(10) Patent No.: US 7,248,524 B2
(45) Date of Patent: Jul. 24, 2007

(54) OPERATING TEMPERATURE OPTIMIZATION IN A FERROELECTRIC OR ELECTRET MEMORY

(75) Inventors: Per-Erik Nordal, Asker (NO); Geirr I. Leistad, Sandvika (NO); Per Bröms, Linköping (SE); Hans Gude Gudesen, Brussels (BE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 11/168,375

(22) Filed: Jun. 29, 2005

(65) Prior Publication Data

US 2006/0007722 A1   Jan. 12, 2006

(30) Foreign Application Priority Data

Jun. 30, 2004   (NO) .................................. 20042771

(51) Int. Cl.
*G11C 7/04* (2006.01)

(52) U.S. Cl. ................. 365/213; 365/145; 365/146; 365/211; 365/171; 365/173; 365/212

(58) Field of Classification Search ............ 365/145 X, 365/146 X, 211 X, 171 X, 173 X, 212 X, 365/213 O
See application file for complete search history.

(56) References Cited

U.S. PATENT DOCUMENTS

| | | | |
|---|---|---|---|
| 5,645,123 A | 7/1997 | Doi et al. | |
| 6,009,033 A | 12/1999 | Li et al. | |
| 6,060,692 A | 5/2000 | Bartley et al. | |
| 6,297,995 B1 | 10/2001 | Mc Connell et al. | |
| 6,332,322 B1 | 12/2001 | Tanaka | |
| 6,906,941 B2 * | 6/2005 | Tran et al. ..................... | 365/66 |
| 7,079,438 B2 * | 7/2006 | Perner et al. ............... | 365/211 |
| 2003/0123282 A1 * | 7/2003 | Nickel et al. ............... | 365/158 |

FOREIGN PATENT DOCUMENTS

| EP | 0 885 447 B1 | 12/1998 |
|---|---|---|
| WO | WO-98/58383 A2 | 12/1998 |
| WO | WO-2004/025658 A1 | 3/2004 |

OTHER PUBLICATIONS

Yang et al., Jpn. J. Appl. Phys. vol. 42 (2003) pp. 1327-1330.
Li et al., IEEE Transactions on Electron Devices, vol. 50, No. 11, Nov. 2003 pp. 2280-2285.

* cited by examiner

*Primary Examiner*—VanThu Nguyen
(74) *Attorney, Agent, or Firm*—Birch, Stewart, Kolasch & Birch, LLP

(57) ABSTRACT

In a heating and temperature control system for a data storage apparatus comprising at least one matrix-addressable ferroelectric or electret memory device, Joule heating means are provided in the memory device, a temperature determining means is connected with controller circuitry and the controller circuitry is connected with an external power supply, which controlled by the former powers the Joule heating means to achieve a selected operating temperature. In a method for operating the heating and temperature control system an ambient or instant temperature of the memory device is determined and compared with the set nominal optimal temperature, and the difference between these temperatures is used in a predefined algorithm for establishing control parameters for the application of power to the Joule heating means to achieve the selected operating temperature in the memory device during an addressing operation thereto.

23 Claims, 6 Drawing Sheets

OPERATING TEMPERATURE OPTIMIZATION IN A FERROELECTRIC OR ELECTRET MEMORY

BACKGROUND OF THE INVENTION

The present invention concerns a heating and temperature control system for a data storage apparatus comprising at least one matrix-addressable ferroelectric or electret memory device, wherein the at least one memory device comprises a ferroelectric or electret memory material provided as a global or patterned thin film forming a memory layer in the memory device, a first set of parallel stripe-like electrodes provided in direct or indirect contact with the memory layer on a surface thereof, a second set of parallel stripe-like electrodes provided oriented orthogonally to the electrodes of the first set and in the same relationship to the memory layer, but on the opposite surface thereof, such that the electrodes of one set constitutes word lines of the at least one memory device and the electrodes of the other set bit lines thereof, wherein a memory cell is defined in a volume of the memory material between a word line and a bit line, such that the number of memory cells in the at least one memory device is given by the number of crossings between word lines and bit lines therein, wherein stored data are represented by one of two specific memory cell polarization states which can be set, detected or changed into the opposite polarization state by applying a potential difference over the memory cell as given by appropriately selected voltage levels applied to the word line and bit line electrodes defining the memory cell, the potential difference corresponding to a switching voltage $V_s$ selected higher than a temperature-dependent coercive voltage $V_c$ of the memory cell; as well as a method for operating a heating and temperature control system.

State of the art memory devices are specified to tolerate substantial variations in operating temperatures, but technical barriers impose restrictions that severely undermine device applicability in many cases. For certain types and projected uses of the memory devices in question, there is a clearly articulated need for future memory systems that are able to operate properly at any temperature in a range between −20 C and +80 C. This vast range in temperature presents substantial design and implementation problems, both for traditional silicon-based memory devices as well as for the emerging non-volatile memories based on ferroelectric and electret materials.

A particularly promising sub-class of the latter is based on organic polymers such as the copolymer P(VDF-TrFE). Whereas such materials exhibit very good qualities in many respects, they are still limited by impaired performance and performance deterioration at low and at high temperatures. Examples of qualities that are affected are operating voltage, device speed, write disturb, imprint and cell fatigue, terms which are well-known to the person skilled in the art. Reasons for the problems can be traced to fundamental attributes of ferroelectrics and electrets that e.g. cause sluggish polarization reversal at low temperatures, as well as interface phenomena in the memory devices at points where the memory substance, i.e. the ferroelectric or electret material, is in contact with (typically metallic) electrodes. Electrode materials, processes and interface materials have been developed that provide satisfactory performance in certain temperature regions, but when the range of operation temperatures for one and the same device is extended to low and high temperatures, the worst case device performance is restricted, as are the number of materials, processes and device architectures that can be used.

From International publication WO2004/025658 there is known a method for operating a ferroelectric or electret memory device. This method particularly concerns applying correction factors to voltage pulses used for reading, refreshing, erasing or writing the memory cells in a ferroelectric or electret memory device. Given that the level of the applied voltage pulses remain the same, a specific memory cell response, for instance switching time or its dynamic polarization behaviour, may change depending on environmental factors or an operatively induced change in conditions that affect the dynamic response behaviour of the memory cells. A parameter that may change due to either environmental or operating factors is the actual temperature of a memory cell and it is well-known that temperature influences the dynamic response of ferroelectric and electret materials, particularly because the coercive field is reduced with an increasing temperature. Consequently also the applied switching voltage can be reduced in proportion to the change in the coercive field. In addition voltage pulse levels as given by the applied voltage pulse protocol, of course, usually as fractions of the switching voltage are then also changed proportionately to the change in the latter switching voltage level.

However, instead of adjusting for instance the voltage pulse parameters to a change in the operating temperature, it could be advantageous to set and maintain an optimal operating temperature in the ferroelectric memory material and hence it would not be required to adjust any voltage pulse parameters applied in the addressing operations. In that connection it should be observed that when the coercive field of ferroelectric or electret materials diminishes with an increase in the temperature of the material, the switching voltage can be also set lower, with the added advantage of reducing the effect of disturb voltages to for instance unaddressed cells in a passive matrix-addressable ferroelectric memory.

In U.S. Pat. No. 6,332,322 (Tanaka, assigned to NEC Corp.) there is disclosed an electronic device with a functional device whose function is achieved at a particular temperature or whose performance is enhanced at a particular temperature. To this end the document teaches a temperature control device for cooling and/or heating a functional device to its desired operating temperature in a reasonably short time and controlling the temperature accurately. The thermal transducers for converting electricity to heat or vice versa are incorporated in a thermally isolated diaphragm formed above a substrate, and particularly this thermally isolated diaphragm includes a device portion which is isolated from the substrate by a cavity. Functional devices may for instance be signal processing circuits, detector circuits, memory circuits or various superconducting devices can be mounted on the device portion of the thermally isolated diaphragm and in thermal contact therewith, such that they can be stabilized at their optimal operating temperature.

Although a temperature control device of this kind can be effectively operated it occupies a fairly large volume and are in relation to the functional circuitry itself and is no solution to the particular problem of controlling the temperature say in a limited portion of an integrated circuit or a memory device, for instance limited to the memory material itself. It is evident that a considerable advantage can be gained if it were possible to obtain an efficient temperature control in an integrated circuit or in a high-density memory device by incorporating the thermal transducers in the circuit itself.

SUMMARY OF THE INVENTION

It is thus a major object of the invention to provide a method and a system that shall be able to set and maintain an optimal operating temperature in memory devices based on ferroelectric or electret materials.

It is also an object of the present invention to provide a method and a system that allow such memory devices to be operated in an extended range of temperatures typically between −20° C. and +80° C.

The above objects as well as further features and advantages are realized according to the present invention with heating and temperature control system comprising at least one Joule heating means provided proximal to the memory layer and in thermal contact therewith, controller circuitry connected with the at least one Joule heating means, a temperature-determining means connected with the controller circuitry for determining an ambient temperature of the memory device or an instant temperature of the memory material thereof, said ambient or instant temperature being compared with a nominal optimal operating temperature value of the memory device and as set in the controller circuitry, an external power supply connected respectively with the at least one Joule heating means and the controller circuitry for supplying power or current to the Joule heating means under control of the controller circuitry such that the memory material before and/or during an addressing operation is set to a specific desired operating temperature above the ambient or instant temperature and lying in a temperature range around the optimal operating temperature value and as given by a defined upper and lower bound; as well as with a method according to the present invention for operating a heating and temperature control system and characterized by determining an ambient temperature of a matrix-addressable ferroelectric or electret memory device, setting a nominal optimal operating temperature $T_0$ for a matrix-addressable ferroelectric or electret memory device in a control circuit connected therewith, determining an ambient or instant temperature of the memory device by means of a temperature determining means connected with control circuit, comparing the determined temperature with a set nominal optimal temperature $T_0$ in the control circuit, applying the difference between said set nominal optimal temperature $T_0$ and the detected ambient temperature in a predefined algorithm stored in the control circuit establishing control parameters for the application of power to one or more Joule heating means in the memory device, and supplying from a power supply means connected to said one or more Joule heating means power or current during and/or under an addressing operation to a memory cell in thermal contact with said one or more Joule heating means, said power or current being continuous or pulsed with and having a voltage amplitude and/or energy integral so as not to generate sneak currents, voltage disturbs, or parasitic couplings in the matrix-addressable memory device, whereby an inadvertent switching of non-addressed memory cells is avoided and the noise level in an output signal kept at a level that enables a reliable detection of a stored logical value in a readout operation.

Further features and advantages shall be apparent from the appended dependent claims.

BRIEF DESCRIPTION OF DRAWINGS

The invention shall now be explained in more detail by resorting to a discussion of exemplary embodiments thereof and with reference to the accompanying drawing figures, in which.

DETAILED DESCRIPTION OF THE INVENTION

In order to better explain the essence of the present invention, it is expedient at this point to provide some definitions of nomenclature used in the following, with reference to FIG. 1. A memory system or device 1 encompasses a core component 2, in the following termed a memory chip, as well as ancillary mechanical and electronic components forming a system which can receive and transmit logic content that is to be stored or retrieved via an interface. The memory chip 2 contains the ferroelectric or electret memory material and constitutes a distinct physical entity inside the memory system or device 1.

Instead of attempting to develop materials, processes and architectures that can meet performance specifications across a very wide temperature range, the present invention teaches a quite different approach that is distinguished by the actions set forth immediately following. Firstly, build the memory chip such that it is optimized for operation in a temperature range $T_0-\Delta T \leq T_{CHIP} \leq T_0+\Delta T$ around a temperature $T_0$, where $T_0$ is selected well above the upper temperature $T_{MAX}$ of the specified ambient temperature operation range $T_{MIN} \leq T_{AMBIENT} \leq T_{MAX}$ of the memory device. Secondly, maintain the memory chip temperature $T_{CHIP}$ within the temperature range $T_0-\Delta T \leq T_{CHIP} \leq T_0+\Delta T$ by heating it electrically and monitoring the chip temperature directly or indirectly.

As can be noted, this proposed solution bears some resemblance to an operating mode adopted for automobile engines. Here the engine is optimized for operation at temperatures well above ambient, and temperature control is achieved by varying the amount of heat transfer to the ambient. In the present instance, the thermal link to the ambient is relatively constant, and temperature control is achieved by varying the heating power level. Common to both cases is that stable and optimized operating conditions are achieved in a simple and efficient manner, even in the face of extreme variations in ambient temperatures, since there is always a temperature differential between the ambient and the point where temperature is to be controlled. In distinction to the case of the automobile engine, the memory chip or surrounding electrical circuitry does not necessarily dissipate much heat, and certain specific measures must be taken to ensure that an elevated temperature can be maintained and controlled.

Figure 1:
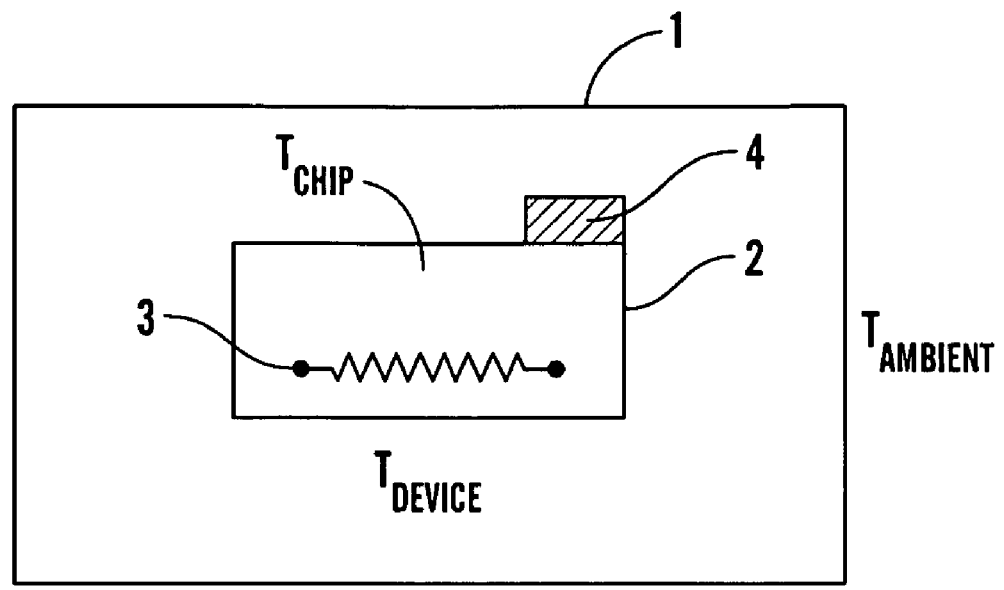
FIG. 1 shows a diagrammatic drawing of a memory device 1 according to the present invention, FIG. 2 a cross section of a memory chip according to the present invention, FIG. 3 a cross section of a memory chip according to the present invention, FIG. 4 a cross section of a memory chip according to a preferred embodiment of the present invention, FIG. 5a a cross section of memory device structures subjected to a simulated heating test, FIG. 5b a temperature curve resulting from the test, FIGS. 6a and 6b respectively a plan view and a cross section of a memory chip according to a preferred embodiment of the present invention, FIG. 7a a cross section of a data storage apparatus according to the invention, FIG. 7b a cross section of a memory device in the data storage apparatus in FIG. 7a, and FIG. 7c a plan view of a matrix-addressable memory with reference cells for determining temperature.

A memory device 1 as used with the present invention is shown schematically in FIG. 1. The memory device is located in an ambient of temperature $T_{AMBIENT}$. A memory chip 2 containing the ferroelectric or electret material is located inside the device, experiencing a local ambient temperature $T_{DEVICE}$. The interior of the memory chip is maintained at a controlled temperature $T_{CHIP}$. A heater 3 is located inside the memory device, and is controlled by a feedback signal derived from a temperature sensor 4 located in proximity to the memory chip 2.

Figure 2:
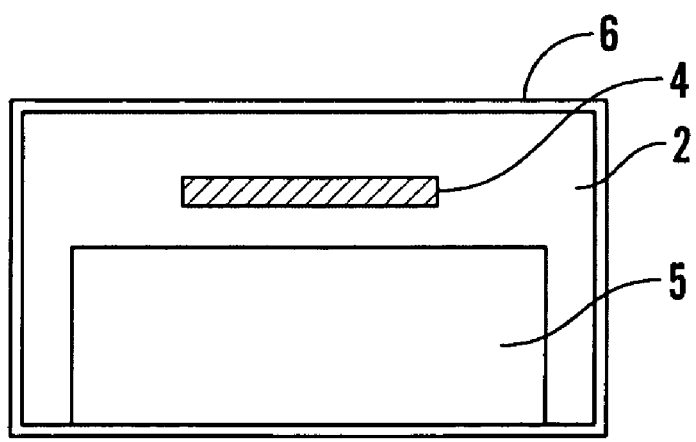

A memory chip 2 as used in the memory device in FIG. 1 is shown in cross section in FIG. 2. The memory chip is provided on a substrate where a substrate bearing the structures containing the ferroelectric or electret memory material, contacting electrodes, electronic circuitry and protecting layers, is symbolized by the block 5. A temperature sensor 4 is located inside an enclosed volume in the memory chip defined by encapsulation 6.

Figure 3:
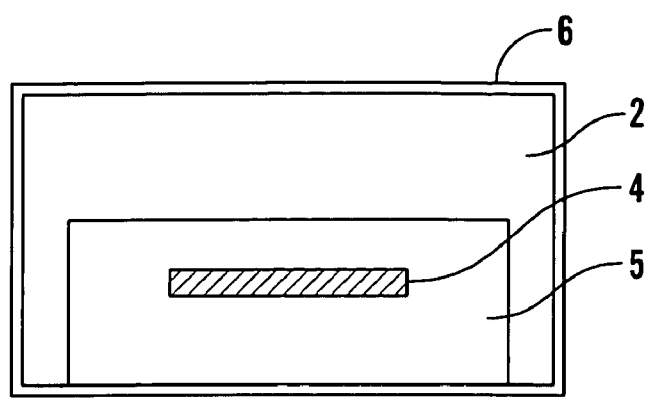

A variant of the memory chip in FIG. 2 is shown in cross section in FIG. 3. Structurally the layout of the variant depicted in FIGS. 2 and 3 are similar. Also here the memory chip is provided on a substrate 5 bearing the structures containing the ferroelectric or electret memory material, contacting electrodes, electronic circuitry and protecting layers. A temperature sensor 4 is integrated into the block 5, in a way which provides close thermal coupling to the memory material.

Within the scope of the present invention, several modes of operation can be discerned and are enumerated as discussed below.

Mode 1

Heating is provided by electrical dissipation within the memory device and/or the memory chip derived from normal operation of the electrical circuitry within. Under normal circumstances in a room temperature ambient, a memory device shall typically reach a temperature plateau rather quickly after start up, e.g. within tens of seconds or less. Depending on various circumstances, the plateau temperature will typically range from approximately 40° C. upwards to 60° C. or, sometimes, up to 80° C.+. Accordingly, the nominal memory chip temperature $T_{CHIP}$ may be defined within a fairly wide temperature window from e.g. 40° C. to 80° C., i.e. well above the room temperature ambient. In keeping with this, mechanical design must take into account the typical power dissipation within the memory device enclosure while making judicious choices regarding heat transfer between the memory device and the ambient. One solution would be to provide good thermal insulation, but with a controlled thermal dissipation to the ambient, e.g. by means of a fan.

Mode 2

In a consumer electronics application it may be acceptable to wait a certain period before using the memory, to allow operational temperature levels to be reached by the system. In a high end computer system, however, the waiting time and lack of precision in the temperature control will in most cases be unacceptable. In such cases it is possible to provide heating separate from that derived through the normal operation of the memory device. An example of this would be locating a heating element inside the memory device, typically with a close thermal coupling to the memory chip. In conjunction with the heater there shall typically be a temperature sensing element which controls the degree of heating and flags when operational status has been reached.

Mode 3

The best thermal control of the memory chip is achieved when the heating element and temperature sensor are integrated into the memory chip itself, in close proximity to the thermally sensitive parts of the same. This shall be discussed further in connection with descriptions of a preferred embodiment of the present invention, cf. below.

Figure 4:
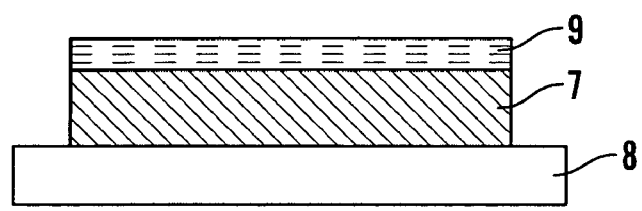

A first preferred embodiment shall now be discussed. It is a memory chip with a global thin-film Joule heater and schematically shown in cross section in FIG. 4. Here the ferroelectric or electret memory material and contacting electrodes are provided as a single-layer or a multilayer stack, constituting a thin film 7 on a substrate 8. A Joule heating device in the form of a thin-film resistor 9 is located on top of the thin film 7, or may be integrated as a layer in the stack in cases where the thin film 7 is a multilayer stack. Generally the memory chip 2 as rendered in any of the FIGS. 1–3 is a planar structure 8 built upon a solid support, typically a silicon substrate. The latter provides electronic circuitry and conductors for managing communication between the memory chip and the rest of the memory device, as well as managing the flow of data and overall electrical operation of the memory chip. The ferroelectric or electret memory material is provided in thin-film form in a single layer 7 or as a sandwiched stack of layers 7 supported on the substrate 8 and contacted by electrically conducting structures defining the individual memory cells and providing electric access. An electrically conducting film 9 is provided on top, being separated electrically from the memory film cells so as not to interfere with the operation of the latter. When connected to a voltage source, this electrically conducting film 9 experiences Joule heating. Heat dissipated in this thin-film heater and generated in the electrical circuitry in the substrate 8 causes the temperature to rise in the memory chip 9. The temperature is monitored by a sensor, which may be a separate physical entity positioned on or inside the memory chip 2, or it may be a system deriving temperature-relevant data by indirect means. Examples of the latter are: i) Perceived (temperature-dependent) resistance of the thin-film heater during or between periods of power being applied, and ii) Switching characteristics of the memory substance. Temperature data are fed into a control logic, and a feedback system adjusts the power applied to the thin-film heater, ensuring that the memory chip temperature is maintained within a predefined temperature range, typically well above the local ambient of the memory chip.

Heat that is generated in the memory chip 2 is conducted away by convection (air or gas surrounding the memory chip), infrared radiation from memory chip surfaces, and conduction through the air or gas (typically small) and the substrate providing the solid support underneath (typically dominant heat loss mechanism). With knowledge of all thermophysical parameters of the relevant materials and by employing mathematical procedures well-known in the art, it is possible to calculate accurately the temperature distribution as a function of time for any relevant structure within the scope of the basic example described here. Thus, given the desired operating temperature range in the memory material and the specified range of temperatures that may be encountered for the internal ambient of the memory device, the physical design of the memory chip and its encapsulation may be optimized with respect to e.g. cost, thermal response and power dissipation.

Figure 5A:
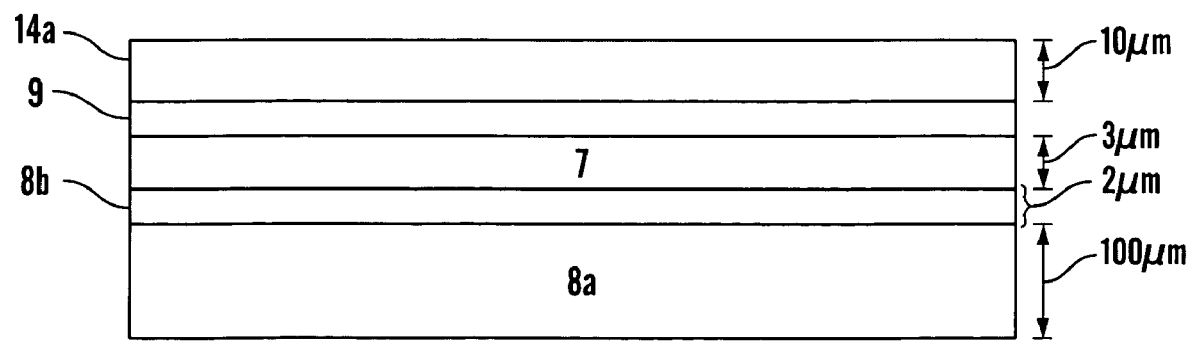

Simulations have been performed on a relevant structure, shown in FIG. 5a consisting from the bottom up of:
1) A silicon substrate 8 of thickness 100 micrometers,
2) An oxidized silicon insulator layer 8a of thickness 2 micrometers,
3) An 8-layer stack of polymeric ferroelectric material 7 of total thickness 3 micrometers,
4) A global heating film 9 with an area of 1×1 cm and 8 ohms sheet resistance (Ω□) dissipating 12.5 W/cm² and,
5) A polymer passivation layer of thickness 10 microns.

Figure 5B:
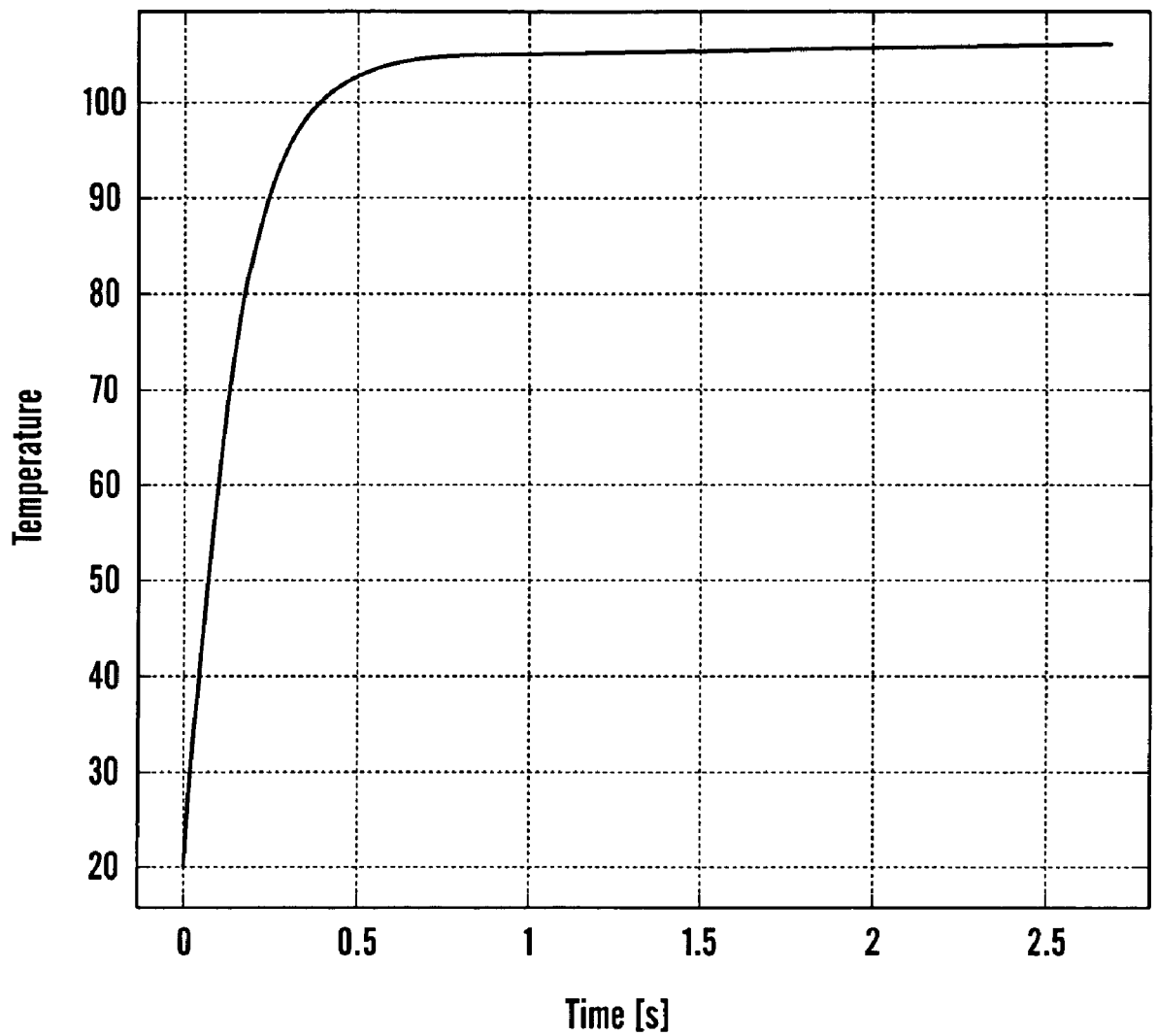

The temperature curve resulting from the test is shown in FIG. 5b as a function of time.

Starting from an ambient temperature of 20° C., it was found that operational temperatures of 60° C. and higher are reached in the center of the memory material stack within tens of milliseconds following application of power to the heating film. Lower power levels are quite adequate for achieving temperatures in the range 60° C. to 90° C. within less than a second.

The above simulation pertains to continuous or quasi-continuous heating of the memory chip. This entails a considerable heat flux down through the silicon substrate and a relatively high electrical power drain in cases where the memory chip is strongly coupled thermally to a cold ambient. An insulating encapsulation can be used in such cases, but a heat-dissipation path is still required from the memory chip to the local ambient. If a wide span in ambient temperatures must be tolerated, analysis shows that it is easier to control the operating temperature, the larger the temperature differential between ambient and operating temperatures.

The same structure as referred to above was also subjected to a simulation where a powerful heat pulse is applied in the heating film for a short period. In this case, a transient heating occurs in the polymer part of the memory chip before heat penetrates into the substrate. This was confirmed by simple estimates of thermal diffusion length μ for periodic heating: Thermal diffusion into a uniform slab of material being heated periodically with a period τ from a planar surface on the slab can be characterized by the thermal diffusion length μ given by:

$$\mu = (\alpha \tau / \pi)^{1/2}, \text{ where}$$

α is the thermal diffusivity: $\alpha = \kappa/c \, \rho \, m^2/s$, and ρ kg/m³ the density.

Selective heating by means of a closely coupled global thin-film heater allows operational temperatures to be reached within the memory material itself in a matter of microseconds. A high peak heating power (typically a few hundred W/cm²) is required, but accumulated energy dissipation per pulse is typically quite low (10–100 mJ) and peak temperatures are well below damage thresholds for all relevant materials including polymers, due to the extremely rapid thermal diffusion across the micrometer distances involved, which represents a very high capacity power drain on the heater. Pulse mode operation as described here is of particular interest in applications where continuous access to the memory chip is not required, and where low average energy consumption over extended time periods is important, e.g. in portable equipment such as cameras and event loggers. Of course, proper precautions must be taken when operating in the pulsed mode to avoid electrical cross-talk from heating pulses disturbing read/write operations.

In cases where rapid activation of a memory device is desired, e.g. immediate start-up of a computer after power-off, simulations like the above show that sub-second heat-up delay is realistic even when starting from low temperatures (e.g. −20° C.). Heat-up on demand is also of interest as an energy-conserving feature in a number of applications where the memory system may be operated in a low average power, intermittent mode, without disrupting ongoing operations Although the resistance film is described here as being located on top of the memory chip structure, it may in principle be located anywhere from the substrate to the top. Also, a stack of memory layers may contain two or more heater films. For pulsed operation, it is desirable to position the heat source in intimate contact with the memory material, but thermally insulated from parts of the memory chip that are efficient heat sinks. In the case of polymer-based memory materials supported on a silicon substrate, this implies that the heating layer be located on top. Furthermore, whereas a global heater film has been described above, it may be patterned to effect selective heating in certain areas, and it may be a continuous film, a mesh or a grid.

Although the memory chip 2 is packaged inside a sealed capsule in the present preferred embodiment, similar technical solutions without encapsulation are also possible and considered part of the present invention.

Figure 6A:
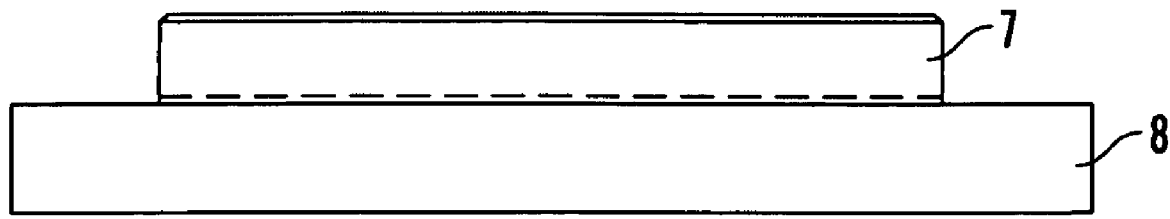
Figure 6B:
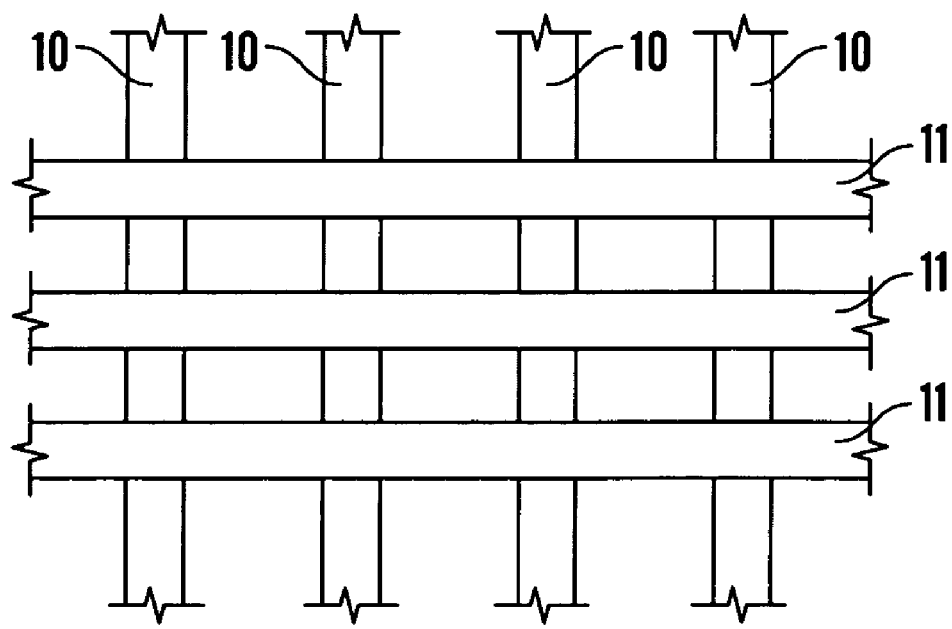

A second preferred embodiment shall now be discussed with reference to FIG. 6. Here the ferroelectric or electret memory material and contacting electrodes are provided as a single layer, constituting a thin film 7 on a substrate 8. The inset shows a top view of part of the electrode arrangement constituting a passive matrix addressing scheme, with bit lines 10 crossing word lines 11. This second embodiment of the invention is implemented in the memory chip in the form of memory chip with Joule heating via passive matrix addressing electrodes.

Passive matrix-addressing schemes for ferroelectric or electret memories are well-known in the art. Basically, a global layer of the ferroelectric or electret memory material is sandwiched between a first set of mutually parallel electrodes underneath and a second set of electrodes on top that are mutually parallel but at right angle to the first set of electrodes. The two sets of electrodes are usually termed bit lines and word lines, respectively. FIG. 5a shows in plan view a portion of a memory chip containing a single layer passive matrix-addressed memory. In ordinary read/write operations, individual memory cells defined in the memory material between crossing electrodes 10, 11 are addressed by selective application of voltages to those electrodes that contact the selected cell or cells. Voltage protocols are well known in the art which ensure that adequate voltages for polarization switching appear at the selected cells only, while minimizing disturbing voltages at non-selected cells. Typically, only low power is dissipated in the bit lines and word lines during ordinary read/write memory operations, where each bit line and word line remains at essentially constant potential along their length. However, by applying a voltage between the endpoints of a given bit line or word line, a current can flow and heating occurs. Since the bit lines and word lines are intimately connected to the ferroelectric or electret material, very fast and efficient heat transfer can be achieved. Thus, by selectively heating one or a few bit lines or word lines, it becomes possible to bring parts of a passive matrix addressed cell array up to optimal operation temperature. Likewise, by heating the whole set of bit lines and/or word lines, the whole memory layer becomes heated, in close analogy with the case of the global resistance film heating described above.

It is understood that heating pulses on the bit lines or word lines must be applied at times when pulsing according to a read/write protocol are not underway.

Figure 7A:
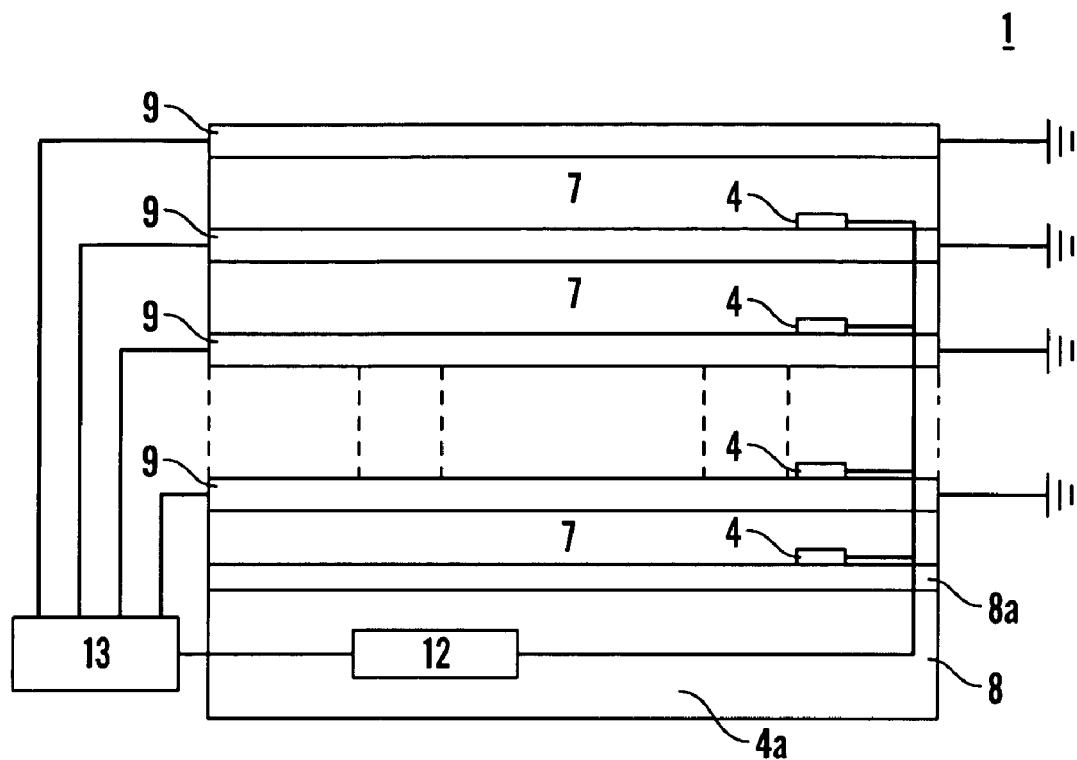
Figure 7B:
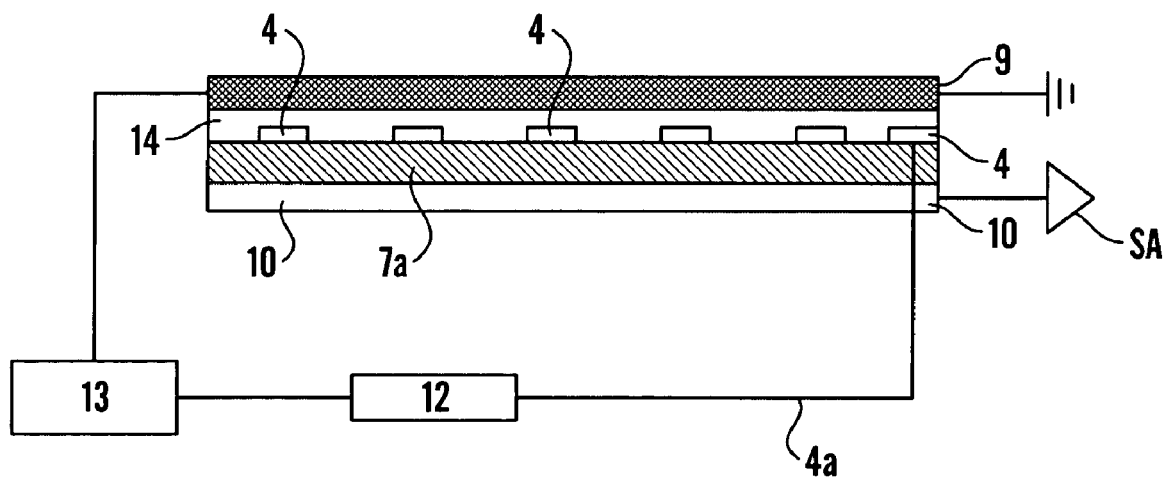

In a practise matrix-addressable ferroelectric or electret memory devices can be stacked to form a volumetric data storage apparatus as shown in section in FIG. 7a. Each layer in the stack herein is actually self-contained memory device consisting of a global thin film of e.g. ferroelectric material sandwiched between the not shown word line electrodes and bit line electrodes. The details for implementing operating memory devices of this kind for storage and accessing of data is well-known to persons skilled in the art and thus need not be elucidated further herein. A topical to the present invention is, of course, the arrangements for determining temperatures in the memory devices and means for heating the memory devices to an optimal operational temperature and maintaining this temperature. FIG. 7a which depicts the stacked memory devices 2 located on a substrate 8 with an insulation layer 8a discloses heating means 9 provided at top of each memory device 2 and in addition there is provided a temperature sensor 4 within each stacked memory device and connected to the temperature controller 12 via a temperature sensor bus 4a. The temperature controller may preferably be located in the substrate and is in its turn connected with a power supply 13 and controls this power supply to deliver the appropriate power to the heating means in order to obtain the optimal operating temperature of the ferroelectric memory devices 2. FIG. 7b shows in cross section and schematically a more detailed view of a separate memory device 2 in the volumetric data storage apparatus 1 depicted in FIG. 7a. Herein of course the global layer 7a of memory material is sandwiched between the bottom electrode set of bit line electrodes 10, and the top electrode set of word line electrodes 11, which are substantially perpendicularly oriented to the bit lines 10. The word line electrodes 11 are covered by a thin layer 14 of electrical insulating material which also serves to planarize the device 2 and a Joule heating source 9 is provided on the top of this insulating layer 14. The Joule heating source 9 can be a global metal film extending over the whole memory device or a connected grid or mesh of metallized lines all kept at the same potential by the power supply 13. A temperature sensor 4 can be provided in a memory device, for instance adjacent to the global thin film or memory material 7a and connected via the sensor bus 4a with a temperature controller 12. It should be noted that as each memory device actually may be very thin, substantially less than 0.5 μm, adequate heating to an optimal operational temperature can be obtained by dispensing with separate Joule heating sources in each memory device 2 in the volumetric data storage apparatus. The Joule heating source can then simply be located over the topmost memory device, that is on the top of the whole memory apparatus, and still be capable of heating each memory device 2 to the optimal operating temperature within an appropriately short time window. As with present-day technologies the data storage apparatus of this kind probably shall not contain more than 4 to 8 stacked memory devices and hence shall have an overall thickness of 2 to 4 microns.

It is of course, quite possible as mentioned above, that at least some of the bit lines and word lines 10;11 in each memory device 2 can be used as the heating elements, thus dispensing with the need of a separate Joule heating source 9. It is then to be understood that for heating purposes electrode lines used as heating elements must be able to form an electric circuit separate from the circuit used for data storage purposes, i.e. the memory circuits, something which of course can be achieved by appropriate switching means or simply by shutting off or isolating the power supply 13. The only disadvantage of this concept would be that the memory addressing operations must be carried out outside the heating cycles in the memory device concerned.

Figure 7C:
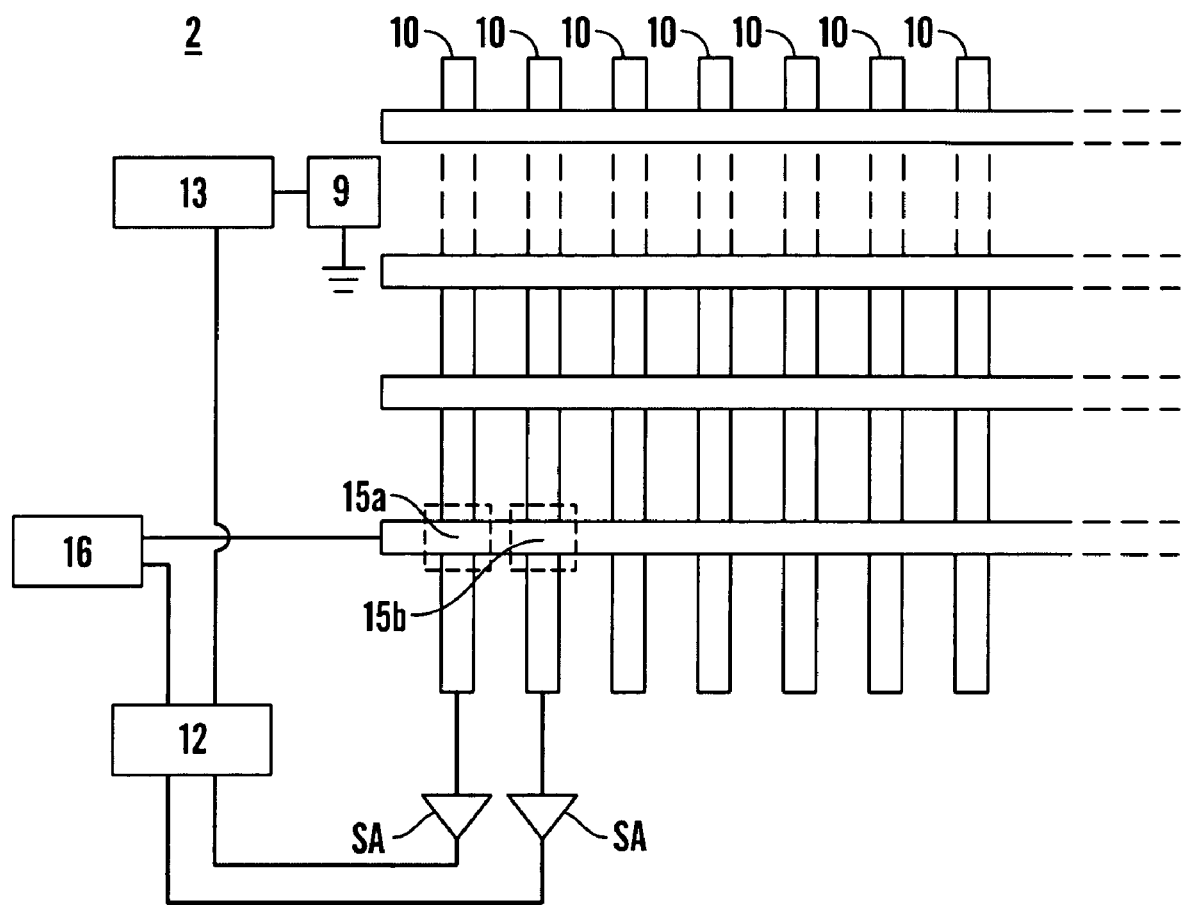

The above-discussed embodiments of the present invention have all been disclosed with a temperature sensor 4 used for sensing an actual temperature of the memory device as known from the above-mentioned International patent publication WO2004/025658. This is not strictly necessary as an actual or operating temperature of the memory device can be determined indirectly. How this can be done shall now be explained with reference to FIG. 7c. Here a portion of a matrix-addressable memory device is shown in plan view with bit lines 10 and word lines 11. The global thin-film memory material 7 located therebetween is not shown. Two of the bit lines in the memory matrix are denoted as reference bit lines 10' and shown connected to sense amplifiers SA for detecting an output current or charge value from an addressed memory cell. Of course, similar sense amplifiers shall be connected to all other bit lines 10 in the memory, but this is not shown here. Now at least two memory cells in the matrix defined at the crossings between reference bit lines 10' and the word lines 11 is allocated as reference memory cells 15a, 15b. These reference memory cells can be written to either of the two polarization states, each representing for instance a logical zero and a logical one. In a read operation an appropriate switching voltage $V_S$ is carefully controlled by a precision voltage controller 16 and applied to the reference memory cells 15a, 15b, resulting in a switching thereof, in other words, in reversal of their respective polarization directions. The output charge or current response signal is sensed and amplified by the sense amplifiers SA and delivered to the temperature controller 12. The memory cell's response is calibrated against the temperature of the memory cell in a carefully controlled operation, e.g. carried out under laboratory conditions, and used to implement a temperature look-up table for determining the temperature directly from the measured dynamic response of the memory cell with the use of a accurately controlled switching voltage level. A change in the temperature shall reflect the change in the coercive field of the memory material and a change in the dynamic response of the memory cell in a readout operation and vice versa. In other words, the actual working temperature of a memory device can now be determined on the basis of the detected response, for instance by means of the look-up table stored in the temperature controller and the desired optimal temperature set in the memory device by applying suitable control parameters to the power supply and heating the memory devices via for instance Joule heating sources provided as mentioned hereinabove. The advantage of resorting to reference memory cells for determining the actual temperature of a memory device in this manner is firstly that the temperature sensors can be dispensed with altogether and in addition it is the actual temperature of a memory cell that is determined, although this may be more or less a theoretical issue as the time constant for the temperature stabilization in thin-film devices of this kind in all probability extremely short.

This embodiment of the present invention need not be limited to single pair of reference memory cells. Several such pairs may be employed and can then be distributed over the matrix-addressable array. Erroneous readings of the dynamic responses can then be tackled with the added advantage of being able to smooth out any temperature differential that might occur in a large memory matrix provided in a correspondingly large die.

As will be evident to persons skilled in the art the present invention shall allow for a more efficient operation of ferroelectric or electret memories irrespective of whether the memory material is an inorganic material such as a ceramic, for instance PZT or similar perovskite-like materials, or organic ferroelectric materials which includes oligomers and polymers and preferably then fluoro compounds such as VDF, TrFE and TFE which particularly have proved suitable in ferroelectric copolymers. Since the coercive voltage decreases with the temperature, this implies that being able to maintain a ferroelectric memory during an addressing operation at a temperature appreciably higher than the ambient shall make the memory material more easily switchable and hence also allow for a reduction in the switching voltage $V_s$ commensurate with the reduction in the coercive voltage $V_c$. This is a particular advantage in passive matrix-addressable ferroelectric memories wherein the memory material all the time is in Ohmic contact with the electrodes. During an addressing operation sneak currents can be generated in the network of electrodes and memory cells, and in addition to parasitic capacitive coupling may occur. Further the addressing of a memory cell can cause a so-called voltage disturb to unaddressed cells, and in sum all these effects could lead to an inadvertent switching of non-addressed cells when carrying out write or read operations in the ferroelectric memory. Being able to reduce the switching voltage $V_s$ shall serve to alleviate the detrimental effects of these phenomena.

Also as well-known to persons skilled in the art a ferroelectric memory that is left unaddressed for some time tends to get struck in the set polarization direction, so-called imprint. This generally amounts to what could be regarded as a large increase in the coercive voltage and shall make readout employing an ordinary switching voltage $V_s$ impossible. A controlled temperature increase and a selected operating temperature well above the ambient temperature, something which generally amounts to a reduction in the coercive voltage, could also serve to obviate the imprint effect and make its removal easier before resuming ordinary addressing operations.

When memory devices are stacked to form a volumetric memory the Joule heating means can be provided in each memory device. Generally ferroelectric memories whether they are stacked or not, are located on a substrate which can be a very effective heat sink and thus the memory device in order to achieve a proper temperature control shall be thermally insulated against the substrate. The Joule heating means can be located on either side of the memory device for instance adjacent to one of the electrode sets and it is trivial that the heating means must be electrically insulated against the electrodes. The various memory devices in the stack are usually mutually isolated and separated by a separation layer between each memory device.

This separation layer may in addition to being electrically insulating also be thermally insulating. However, this in principle implies that Joule heating means shall be provided in each memory device of the stack of this kind. However, in an advantageous embodiment the stack is formed with word lines and bit lines alternating and without separation layers between the memory devices, i.e. the bit lines in the top electrode layer of a first memory device in the stack shall now form the word lines in the following memory device of the stack and so on. In this case Joule heating means can be provided in the topmost memory device in the stack. Given the very small thickness of each memory device, in the order of 500 nm, it is easily seen that a selected operating temperature can be achieved and stabilized in a matter of microseconds in all devices in the stack, particularly when the lowermost device in the stack is thermally isolated against the substrate. As evident, in this embodiment of course each memory device only can be accessed in succession, but that would in any case be common as it is more economical that all memory devices share the same driver and control circuitry and the same set of sense amplifiers.

As mentioned above, separate Joule heating means in the memory devices could be discarded and instead the word line and bit lines of the memory device itself be employed as resistive heating elements. Current or power in order achieving Joule heating of the electrodes to be applied with constant voltage amplitude a couple of microseconds before an addressing operation is initiated. Alternatively a time-varying voltage, for instance a high-frequency alternating current could be used, but in any case of course either the voltage amplitude or the time integral of the supplied power should be chosen so as not to trigger any inadvertent switching of the memory cells contacting the electrodes. It would also be an advantage and obvious choice to apply the power to the heating means in step with switching operations such that heating cycles alternate with addressing cycles. The effect would be to deliver a heating pulse to the memory material which in the allotted time interval would heat and stabilize at the selected operating temperature, which of course need not be exact equal to the set nominal optimal operating temperature, but could lie in an interval about the value of the latter.

The invention claimed is:

1. A heating and temperature control system for a data storage apparatus comprising at least one matrix addressable ferroelectric or electret memory device, wherein the at least one memory device comprises:

a ferroelectric or electret memory material provided as a global or patterned thin film forming a memory layer in the memory device, a first set of parallel stripe-like electrodes provided in direct or indirect contact with the memory layer on a surface thereof, a second set of parallel stripe-like electrodes oriented orthogonally to the electrodes of the first set and in the same relationship to the memory layer, but on the opposite surface thereof, such that the electrodes of one set constitutes word lines of the at least one memory device and the electrodes of the other set bit lines thereof, wherein a memory cell is defined in a volume of the memory material between a word line and a bit line, such that the number of memory cells in the at least one memory device is given by the number of crossings between word lines and bit lines therein, wherein stored data are represented by one of two specific memory cell polarization states which can be set, detected or changed into the opposite polarization state by applying a potential difference over the memory cell as given by appropriately selected voltage levels applied to the word line and bit line electrodes defining the memory cell, the potential difference corresponding to a switching voltage $V_s$ selected higher than a temperature dependent coercive voltage $V_c$ of the memory cell, and wherein the heating and temperature control system includes:

at least one thin film Joule heating means provided proximal to the memory layer and in thermal contact therewith, controller circuitry connected with the at least one Joule heating means, a temperature determining means connected with the controller circuitry for determining an ambient temperature of the memory device or an instant temperature of the memory material thereof, said ambient or instant temperature being compared with a nominal optimal operating temperature value of the memory device and as set in the controller circuitry, an external power supply connected respectively with the at least one Joule heating means and the controller circuitry for supplying power or current to the Joule heating means under control of the controller circuitry such that the memory material before and/or during an addressing operation is set to a specific desired operating temperature above the ambient or instant temperature and lying in a temperature range around the optimal operating temperature value and as given by a defined upper and lower bound.

2. A heating and temperature control system according to claim 1, wherein the at least one Joule heating means is a continuous resistance thin film provided parallel to a surface of the memory layer and coextensive therewith, said resistance thin film being at least electrically insulated from the electrode set provided in direct or indirect contact with the same surface.

3. A heating and temperature control system according to claim 1, wherein said at least one Joule heating means is a grid like resistance thin film provided parallel to a surface of the memory layer and coextensive therewith, said grid like resistance thin film being at least electrically insulated from the electrode set provided in direct or indirect contact with the same surface.

4. A heating and temperature control system according to claim 2 or claim 3, wherein the resistance thin film is a metallic thin film.

5. A heating and temperature control system according to claim 1, wherein the at least one Joule heating means is one or more of the word lines and/or the bit lines of the at least one memory device.

6. A heating and temperature control system according to claim 1, wherein the temperature determining means comprises a temperature sensor provided in the at least one memory device.

7. A heating and temperature control system according to claim 6, wherein said temperature determining means comprises at least two reference memory cells in the matrix addressable array of the at least one memory device.

8. A heating and temperature control system according to claim 7, wherein the reference memory cells are connected via respective sense amplifiers to the controller circuitry whereby an actual temperature of the memory material is determined by comparing a detected dynamic response to a potential difference applied over the reference memory cells with temperature calibration values of a look up table stored in the controller circuitry.

9. A heating and temperature control system according to claim 1, wherein the data storage apparatus comprises more than one memory devices, the memory devices being stacked to form a volumetric memory.

10. A heating and temperature control system according to claim 9, wherein the at least one Joule heating means are provided in one or more of the stacked memory devices.

11. A heating and temperature control system according to claim 9, wherein the at least one Joule heating means is provided only in the topmost memory device of the stack.

12. A heating and temperature control system according to claim 9, wherein the at least one Joule heating means is provided in every memory device of the stack.

13. A heating and temperature control system according to claim 1, wherein the at least one memory device is provided on a substrate, the at least one memory device being thermally insulated from the substrate.

14. A heating and temperature control system according to claim 1, wherein the at least one memory device comprises a passive matrix addressable array of memory cells.

15. A heating and temperature control system according to claim 1, wherein the ferroelectric or electret memory material is an organic material selected among oligomers, polymers, copolymers, or terpolymers or blend or compositions thereof.

16. A heating and temperature control system according to claim 1, wherein said organic material comprises vinylidene fluoride (VDF), trifluoroethylene (TrFE), or tetrafluoroethylene (TFE).

17. A method for operating a heating and temperature control system in a data storage apparatus comprising at least one matrix-addressable ferroelectric or electret memory device, the method comprising:

determining an ambient temperature of a matrix addressable ferroelectric or electret memory device, setting a nominal optimal operating temperature $T_0$ for a matrix addressable ferroelectric or electret memory device in a control circuit connected therewith, determining an ambient or instant temperature of the memory device by means of a temperature determining means connected with control circuit, comparing the determined temperature with the set nominal optimal temperature $T_0$ in the control circuit, applying the difference between said set nominal optimal temperature $T_0$ and the detected ambient temperature in a predefined algorithm stored in the control circuit, establishing control parameters for the application of power to one or more Joule heating means in the memory device, and supplying from a power supply means connected to said one or more Joule heating means power or current before and/or during an addressing operation to a memory cell in thermal contact with said one or more Joule heating means, said power or current being continuous or pulsed with a voltage amplitude and/or energy integral so as not to generate sneak currents, voltage disturbs, or parasitic couplings in the matrix addressable memory device, whereby an inadvertent switching of non addressed memory cells is avoided and the noise level in an output signal kept at a level that enables a reliable detection of a stored logical value in a readout operation.

18. A method according to claim 17, comprising keeping a selected operating temperature of the memory material during an addressing operation centered about the set optimal nominal temperature T0 within upper and lower bounds $\pm\Delta T$.

19. A method according to claim 18, comprising selecting the set nominal optimal temperature $T_0$ higher than a maximum ambient temperature $T_{MAX}$ specified for normal operation of the memory device.

20. A method according to claim 18, comprising setting $T_0 - T_{MAX} > 20°$ C.

21. A method according to claim 18, comprising selecting the actual operating temperature during an addressing operation greater than 40° C.

22. A method according to claim 17, comprising controlling the application of power or current to one or more Joule heating means such that the latter generates one or more heating pulses of a predetermined duration t to limit a thermal penetration depth $\mu$ into the memory material to less than the thickness of the memory layer.

23. A method according to claim 17, comprising adjusting the actual switching voltage $V_s$ applied in an addressing operation in dependency of the set nominal optimal temperature or the selected operating temperature of the memory cell during the addressing operation.

* * * * *